(12) United States Patent
Kajiki et al.

(10) Patent No.: US 6,696,751 B2
(45) Date of Patent: Feb. 24, 2004

(54) SEMICONDUCTOR DEVICE AND PORTABLE DEVICE HAVING A MOUNTING REGION SHARING POINT SYMMETRY

(75) Inventors: Atsunori Kajiki, Nagano (JP); Kenji Iida, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/776,631

(22) Filed: Feb. 6, 2001

(65) Prior Publication Data

US 2001/0013646 A1 Aug. 16, 2001

(30) Foreign Application Priority Data

Feb. 10, 2000 (JP) .................................... 2000-033970

(51) Int. Cl.⁷ .............................................. H01L 23/495
(52) U.S. Cl. .................. 257/676; 257/692; 257/777; 257/778; 257/782; 257/797
(58) Field of Search .............................. 257/676, 692, 257/777, 778, 782, 797

(56) References Cited

U.S. PATENT DOCUMENTS 6,165,814 A * 12/2000 Wark et al. ................ 438/108
6,242,800 B1 * 6/2001 Munos et al. .............. 257/712
6,281,450 B1 * 8/2001 Urasaki et al. ............. 174/261
6,326,232 B1 * 12/2001 Tani et al. .................. 438/106

FOREIGN PATENT DOCUMENTS

| JP | 10-65374 A | * 8/1996 | ........... H01L/23/36 |
| JP | 2000-305469 A | * 11/2000 | ........... H01J/17/28 |

* cited by examiner

Primary Examiner—Allan R. Wilson
Assistant Examiner—Matthew E. Warren
(74) Attorney, Agent, or Firm—Staas & Halsey LLP (57) ABSTRACT

In conventional semiconductor devices, customarily, it is sought to position the mounting region of a semiconductor element in the center of a package, and hence the dimensions of the package are increased unnecessarily, but the object of the present invention is to avoid unnecessary increasing of the package dimensions, without impairing the required functions of the semiconductor device. Unnecessary increasing of package dimensions is avoided by providing a semiconductor device comprising a package having a semiconductor element mounting region, a first region containing the aforementioned mounting region, and a second region partially adjoining the periphery of the above-described first region.

3 Claims, 9 Drawing Sheets

PRIOR ART

FIG. 3

PRIOR ART

FIG. 4

PRIOR ART

SEMICONDUCTOR DEVICE AND PORTABLE DEVICE HAVING A MOUNTING REGION SHARING POINT SYMMETRY

BACKGROUND OF THE INVENTION

1. Field of the Invention

The present invention relates to a semiconductor device and a method for manufacturing same, and more particularly, to a semiconductor device comprising a semiconductor element(s) and a package on which these semiconductor elements are mounted.

2. Description of the Related Art

In recent years, with market demands for compactification and weight reduction with respect to electronic devices, or portable devices in particular, there has been especially strong requirement for reduction in the size and weight of semiconductor devices. In a conventional single chip package, when positioning and mounting an LSI chip (or semiconductor element), it is customary for the centre of the LSI chip (or semiconductor element) to be aligned with the centre of the chip mounting region on the package. This is because emphasis is given to the uniformity of the semiconductor device on which the single chip package and LSI chip are positioned and mounted, and in practice, there has been little occurrence of physical imbalance in the vertical or lateral directions, and this has helped to achieve a stabilized product quality.

Figure 3:
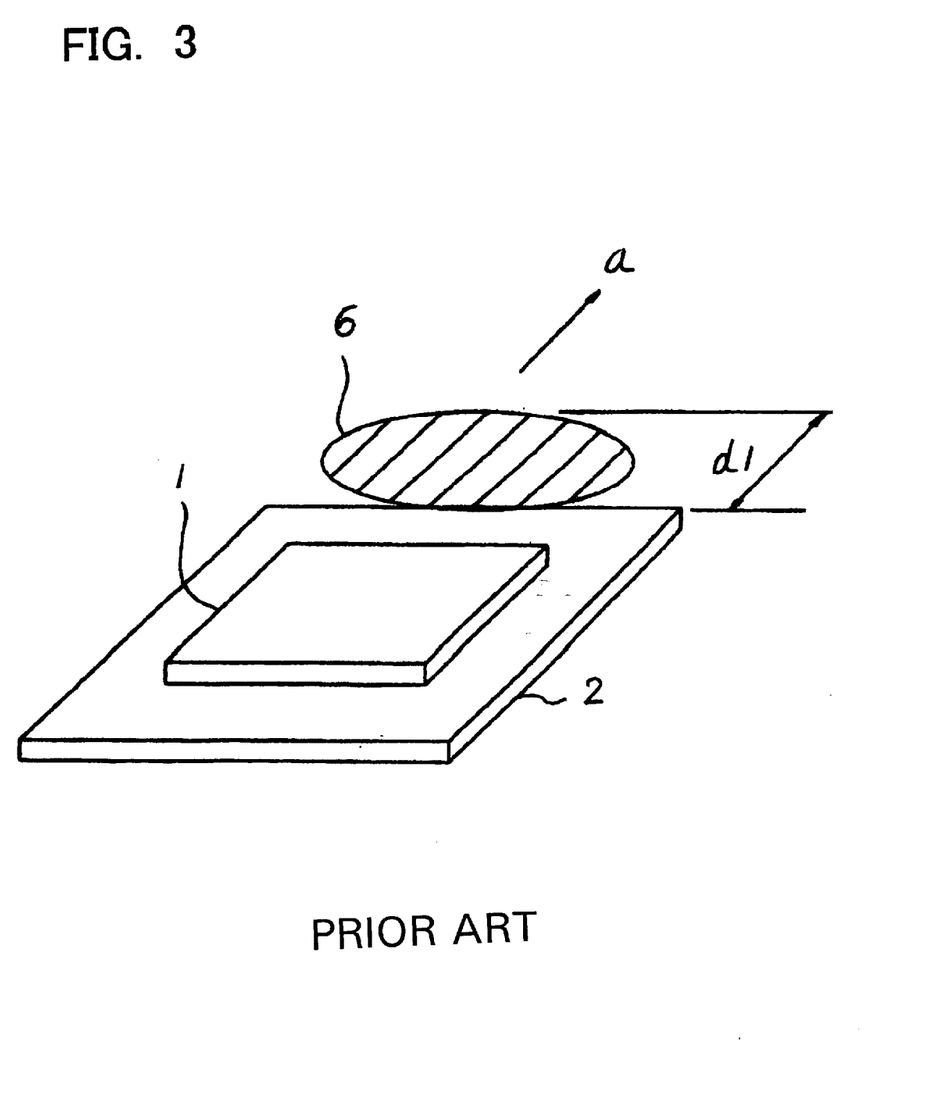
FIG. 3 is an explanatory diagram of technological requirements relating to a semiconductor package.
Figure 4:
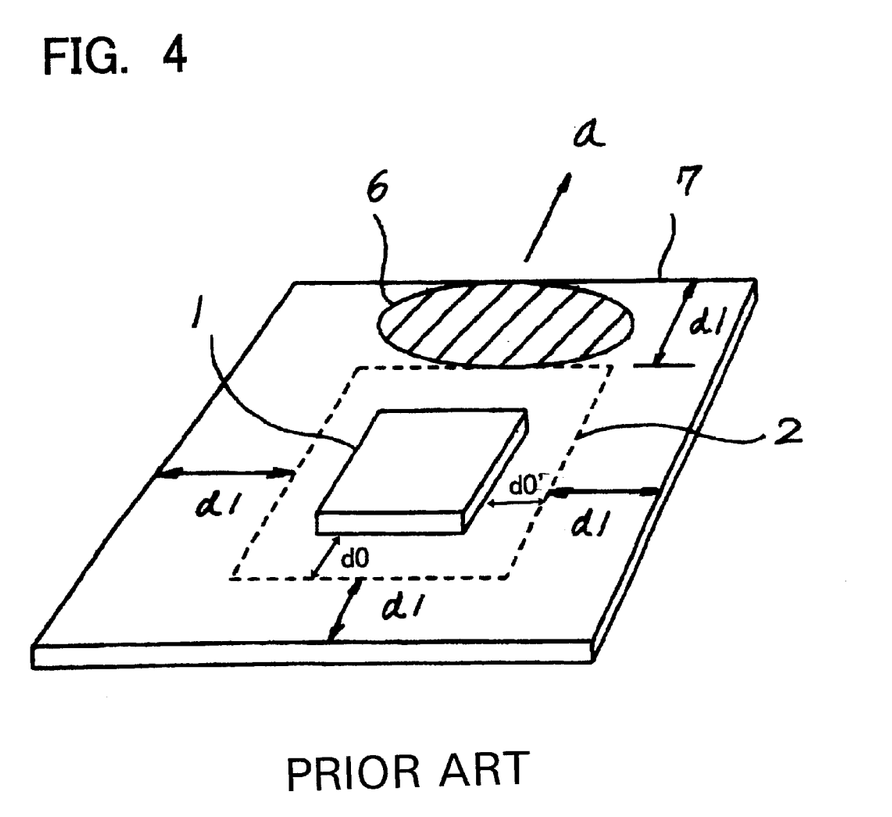
FIG. 4 is a perspective view of a semiconductor device according to the prior art.

However, since uniformity is emphasized in this manner, in cases where it is required, for whatever reason, to provide expansion outside the single chip package in a region or regions which face one to three edges (several locations) of the chip package, a method has been adopted whereby the other regions thereof are expanded in an equal fashion, in order to maintain uniformity (line symmetry and point symmetry). In other words, as illustrated in FIG. 3, in a case where, for whatever reason, the need arises to expand a region 6 having a distance d1 in the direction of the arrow a, outside of one edge of a single chip package 2 having an LSI chip 1 mounted in the centre thereof, according to the existing concept, expansion is not only performed in this single direction, but also in the regions outside the other three edges thereof by the same distance d1 from the original single chip package 2, provided that the single chip package 7 permits the expansion region 6, as illustrated in FIG. 4. Moreover, in a multi-chip module (MCM) whereon a plurality of chips are mounted, the chips are disposed and mounted in a uniform fashion on the MCM package, in order to maintain uniformity (line symmetry and point symmetry).

Therefore, in the case of either a single chip package or a multi-chip module (MCM), there has been a problem in that, in its ultimate form, the semiconductor device is enlarged unnecessarily, in order to maintain uniformity (line symmetry, point symmetry).

SUMMARY OF THE INVENTION

With the foregoing in view, it is an object of the present invention to avoid unnecessary enlargement of semiconductor devices, by providing a semiconductor device having improved geometrical relationships between a semiconductor chip and a semiconductor chip mounting region of a package.

Thorough research into methods for providing a semiconductor device having improved geometrical relationships between semiconductor chips and the semiconductor chip mounting regions of a package has been conducted.

As a result of this research, it was discovered: that the aforementioned uniformity means point symmetry, line symmetry and equidistant spacing (for example, the semiconductor elements are disposed in an equidistantly spaced manner), and the like; and that the reason that uniformity of this kind is emphasized is that there is a firm belief that it is advantageous in terms of workability and device operating characteristics in the manufacturing processes for semiconductor devices and electronic products using same, and there is no merit in consciously discarding this uniformity. There is also a reason that if uniformity is impaired, distortion may occur in the semiconductor device, leading to problems of assembly errors, or performance faults, or the like, in the various manufacturing stages leading up to completion of an electronic product.

To add to the above, it was also discovered that if uniformity was disregarded, rather than being emphasized, then especially in cases where a plurality of semiconductor elements are mounted on a semiconductor device, merits are obtained in that greater freedom is gained with regard to combinations of sizes and introduction of multiple-stage bonding arrays becomes possible, and provided that the size of the semiconductor elements themselves is within a certain size, the problem of distortion can be substantially resolved, and hence the present invention has been established. The beneficial effects of the present invention are particularly notable in cases where the size of the semiconductor device is 19 mm×19 mm or smaller, and the number of semiconductor elements mounted thereon is between 1–4.

More specifically, the present invention is as follows.

1. A semiconductor device comprising a package having: a mounting region for mounting at least one semiconductor element; a first region containing the above-described mounting region and substantially sharing point symmetry with the above-described mounting region, wherein the width of the portions of the first region not including the above-described mounting region is substantially uniform; and a second region provided at a perimeter edge of the above-described first region and not substantially sharing point symmetry with the above-described mounting region.

2. The semiconductor device described in 1 above, wherein there exist a plurality of second regions which are not mutually contacting.

3. The semiconductor device described in 1 above, wherein the above-described mounting region and the above-described second region substantially share line symmetry.

4. The semiconductor device described in 1 above, wherein the above-described second region contacts two or more edges of the above-described first region.

5. The semiconductor device described in 1 above, comprising at least one connecting means between the above-described first region and the above-described semiconductor element.

6. The semiconductor device described in 1 above, wherein the above-described first region and the above-described second region are formed in different planes.

7. The semiconductor device described in 1 above, wherein the above-described semiconductor element is mounted on the mounting region by a flip chip bonding, under-fill resin is filled into the gap between the above-described semiconductor element and the above-described mounting region, and a region for supplying the above-described under-fill resin is formed in the above-described second region.

8. The semiconductor device described in 1 above, wherein first bonding pads are disposed in the above-described first region, second bonding pads are disposed in the above-described second region, respectively, and first lead wires and second lead wires leading from the above-described semiconductor element are connected respectively to the above-described first and second bonding pads.

9. The semiconductor device described in 8 above, comprising the first bonding pads and the second bonding pads disposed in an alternating zigzag pattern.

10. A portable device containing the semiconductor device described in any one of 1 to 9 above.

11. A method for manufacturing the semiconductor device described in 1 above, comprising the steps of: mounting the above-described semiconductor element on the mounting region by means of a flip chip bonding; supplying under-fill resin to the above-described second region; and causing the above-described under-fill resin in the second region to move to the above-described first region and fill into the gap between the above-described semiconductor element and the above-described mounting region.

12. A method for manufacturing a semiconductor device described in 1 above, comprising the steps of: arranging first bonding pads in the above-described first region; arranging second bonding pads in the above-described second region; and connecting first and second lead wires derived from the above-described semiconductor element respectively to the above-described first and second bonding pads.

Figure 6:
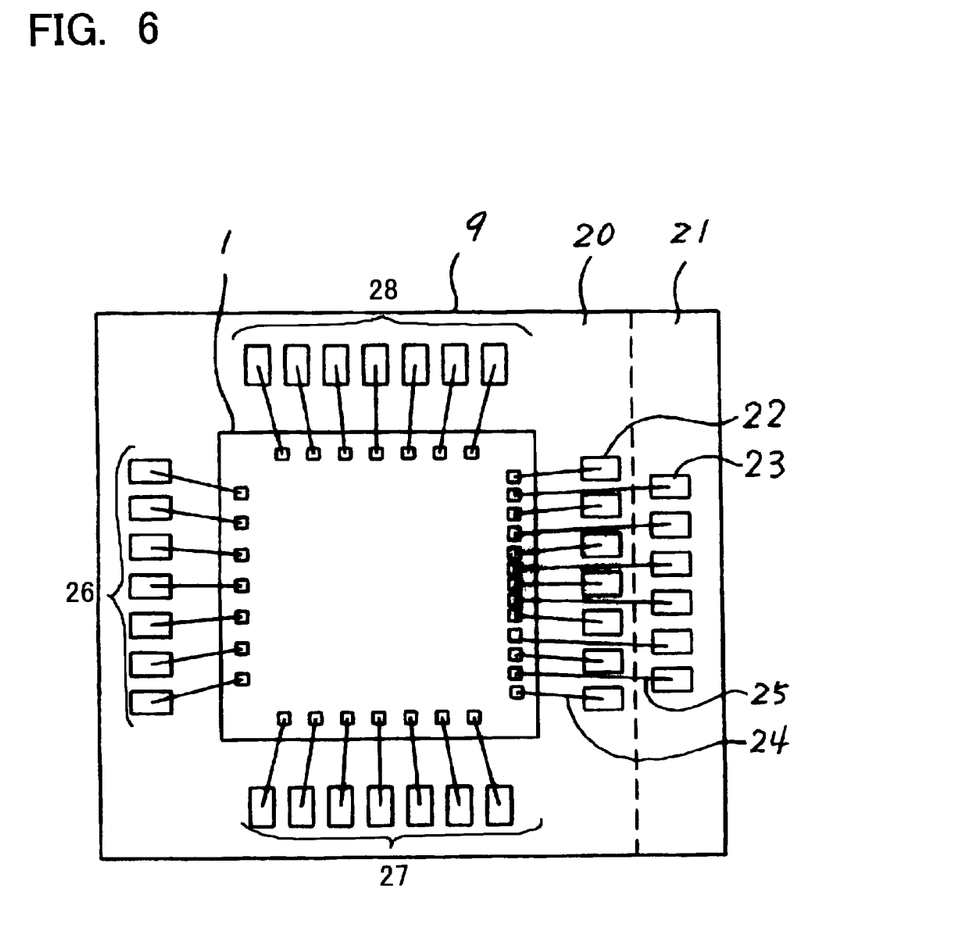
FIG. 6 is an upper face view of a semiconductor device according to a third embodiment of the present invention.

In the foregoing, if a plurality of the connection means are disposed between the first region and the semiconductor elements, they are desirably disposed with respect to the above-described mounting region at a substantially equidistant spacing. Here, "disposed with respect to the above-described mounting region" indicates an arrangement in ranks with respect to the mounting region, as illustrated in FIG. 6. Furthermore, "substantially equidistant spacing" indicates inclusion of cases where several means are not equidistantly spaced, the degree of tolerance allowed here being derivable by trial and error.

In the foregoing, "semiconductor element" comprises not only single chips, but also multiple chips, such as LSI chips, diodes, transistors, and the like. This naturally includes cases where a plurality of chips are mounted on a package.

Moreover, "sharing point symmetry" means that the positions of the respective centre points of point symmetry mutually coincide, and "not sharing point symmetry" means that the positions of the respective centre points of point symmetry are different, or that one region does not have point symmetry.

Furthermore, "sharing line symmetry" means that the positions of the respective centre lines of line symmetry mutually coincide.

Moreover, in the specification of the present application, "mounting region" indicates a surface portion of a package which is covered by a semiconductor element, when there is one semiconductor element mounted on the package. For example, in the case of FIG. 4, this corresponds to the portion covered by the semiconductor element 1. In this case, the "first region" is the region demarcated by the dotted line in FIG. 4, which contains the "mounting region". The "second region" is the region of the surface of the package 7 excluding the region contained by the dotted line.

If a plurality of semiconductor elements are mounted on a package, then the "mounting region" indicates the surface regions of the package covered by the semiconductor elements, plus the inner region circumscribed about the surface regions of the package covered by the plurality of semiconductor elements, and consequently, in the case of FIG. 9 described hereinafter, it corresponds to the region numbered 53.

Moreover, the reference to "the width of the portions not including the above-described mounting region is uniform" in item 1 above indicates, for example, that the lengths of d0 and d0' in FIG. 4 and FIG. 9 below are equal.

Figure 9A:
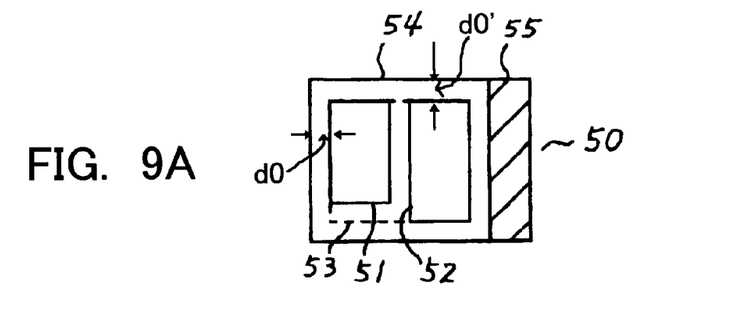
FIG. 9 shows upper face views of MCM packages according to a sixth embodiment of the present invention.
Figure 9B:
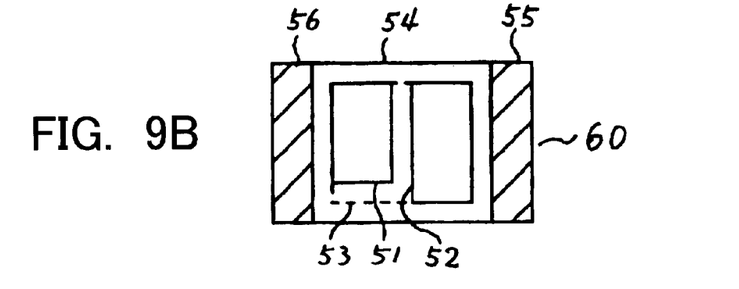
Figure 9C:
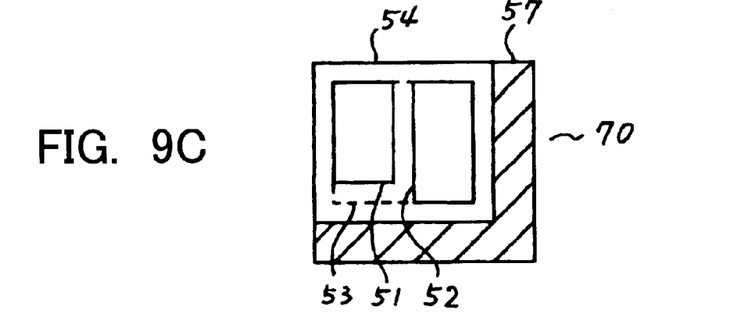
Figure 9D:
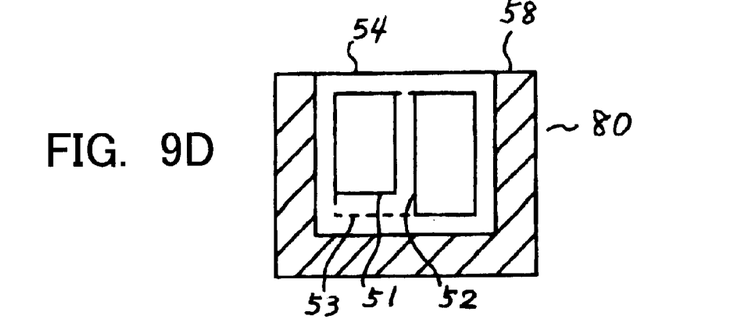

Furthermore, the second region in item 1 above corresponds, for example, to number 55 in FIG. 9(A), number 57 in FIG. 9(C), and number 58 in FIG. 9(D).

In this way, it was judged that, even if a second region is created and the uniformity of the semiconductor device is impaired, a satisfactory semiconductor device is obtained.

More specifically, it was judged that, provided that the semiconductor device is within the size 19 mm×19 mm, an equal defective product rate can be achieved compared to a conventional case where uniformity is maintained.

Numbers 55 and 56 in FIG. 9(B) show an example of item 2 above.

FIGS. 9(A), (B) correspond to item 3 above.

FIGS. 9(B), (C), (D) correspond to item 4 above.

The arrangement of the bonding pads 22, 26, 27, 28 in FIG. 6, described hereinafter, corresponds to item 5 above.

In item 6 above, it was judged it is advantageous since the lead wire arrangement is made simpler. This is because wiring is performed three-dimensionally.

In the second region, it is also possible to form a region for supplying under-fill resin, as indicated by item 7 above, and to arrange second bonding pads, as indicated by item 8 above, and to arrange testing and measuring pads, as illustrated by the fifth embodiment described hereinafter.

If second bonding pads are arranged in the second region, as indicated in item 9 above, it is desirable from the viewpoint of manufacturing a compact device, that the first bonding pads and second bonding pads are arranged alternately in a zigzag fashion.

As a result of research relating to manufacture, it was judged that if the manufacturing method according to item 11 or 12 above is employed, a device according to items 1 to 9 above can be manufactured at a good yield rate, whilst producing little distortion.

The uniformity (line symmetry, point symmetry, equidistant spacing) referred to in the present invention does not refer to geometrical uniformity in a strict mathematical sense, but naturally includes errors in manufacturing technology and indicates, rather, a state where no conditions intentionally obstructing uniformity are applied.

DESCRIPTION OF THE PREFERRED EMBODIMENTS

Embodiments of the present invention are described below.

(First Embodiment)

Figure 1:
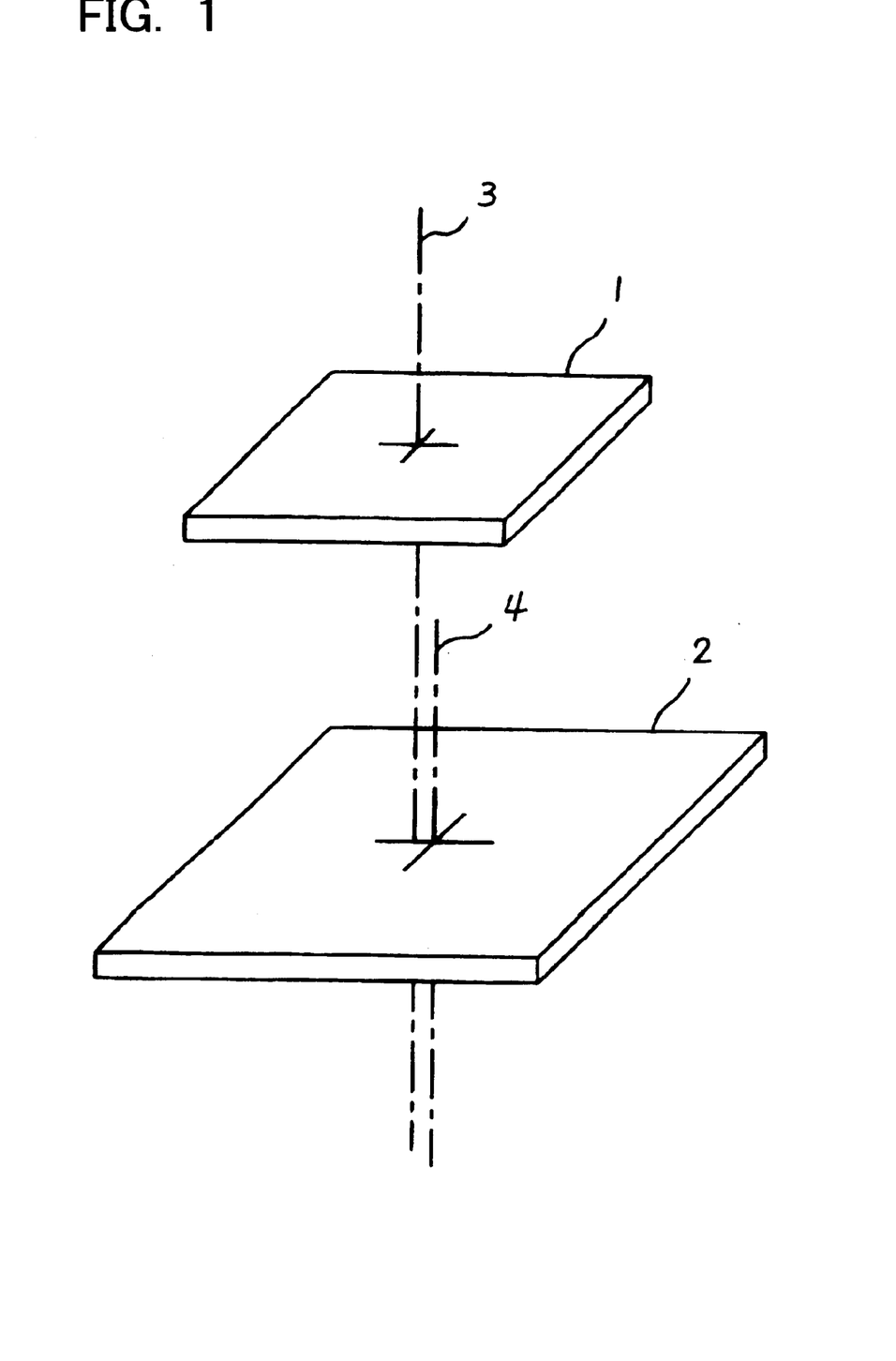
FIG. 1 is a perspective view of a semiconductor element and package according to a first embodiment of the present invention.
Figure 2:
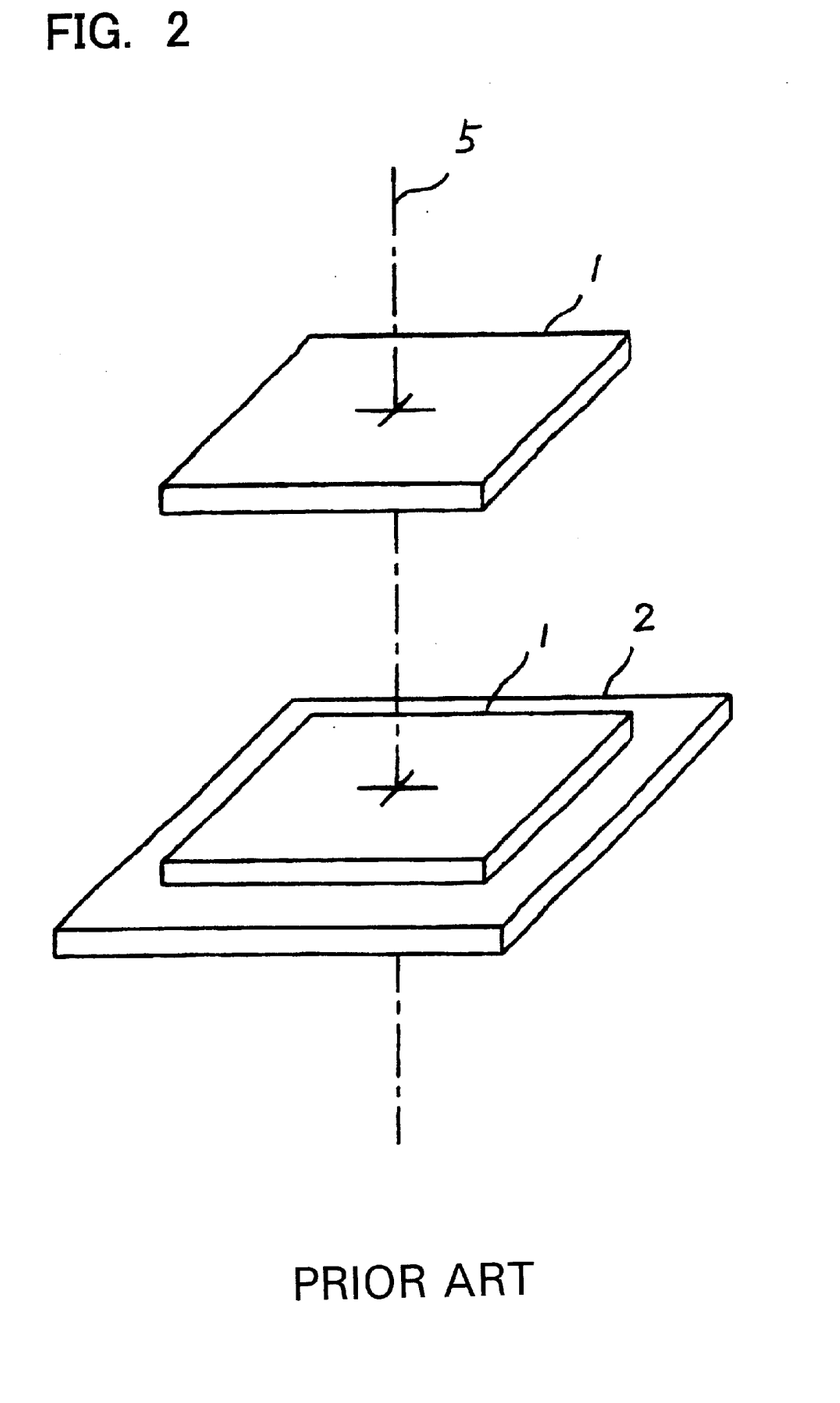
FIG. 2 is a perspective view of a semiconductor element and package according to the prior art.

FIG. 1 is a perspective view of a semiconductor element and package according to a first embodiment of the present invention. This diagram illustrates a state where positioning and mounting of an LSI chip 1 is performed without the centre line 3 of the LSI chip 1 being aligned with the centre line 4 of a single chip package 2. FIG. 2, on the other hand, is a perspective view of a semiconductor element and package according to the prior art, illustrating a state where positioning and mounting is performed with an LSI chip 1 and a single chip package 2 having a common centre line 5.

(Second Embodiment)

Figure 5:
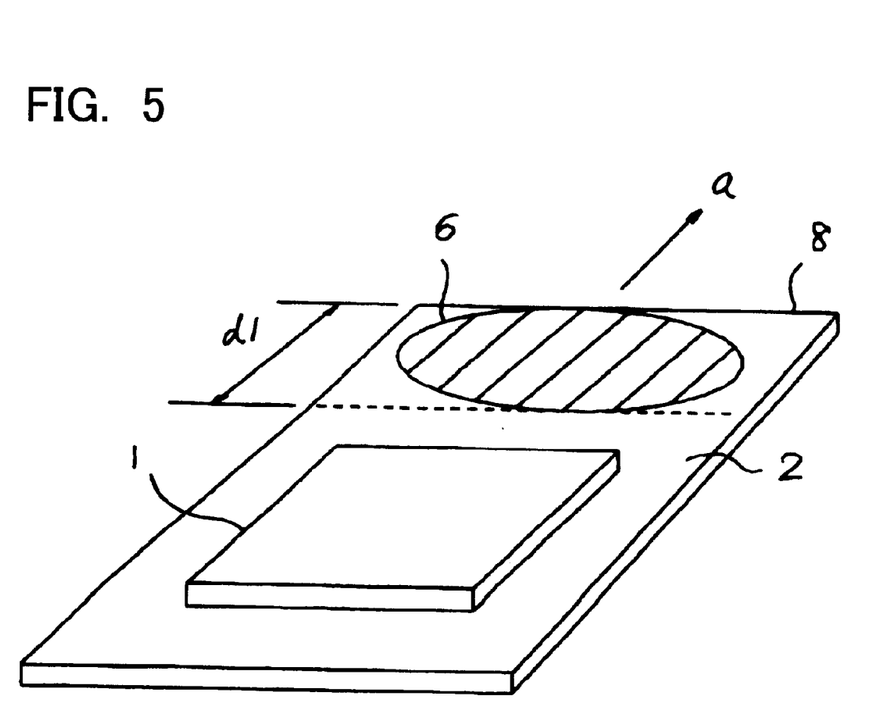
FIG. 5 is a perspective view of a semiconductor device according to a second embodiment of the present invention.

FIG. 5 is a perspective view of a semiconductor device according to a second embodiment of the present invention. This diagram illustrates a state where positioning and mounting of an LSI chip 1 is performed without aligning the centre of the LSI chip 1 with the centre of a single chip package 8 which has been expanded in one direction only. In other words, it illustrates a design concept of a single chip package, wherein, if the need arises for a region 6 having distance d1 to be expanded in the direction of arrow a, the original single chip package 2 is expanded by a distance d1 in that direction only.

(Third Embodiment)

FIG. 6 is an upper face view of a semiconductor device according to a third embodiment of the present invention.

This depicts, as a more specific example, a single chip package 9 expanded in one direction only, wherein first groups of bonding pads 22, 26, 27, 28 disposed equidistantly on four sides of an LSI chip 1 are provided in a first region 20 of a package and a second group of bonding pads 23 is provided in a second region 21 thereof expanded adjacently in one direction only, first and second wires as exemplified by numbers 24 and 25 being connected from the LSI chip 1 to the respective bonding pads.

In this case also, the centre of the LSI chip 1 does not coincide with the centre of the mono-directionally expanded single chip package 9.

The first group and second group of bonding pads 22, 23 disposed on either side of the boundary between the first region 20 and the second region 21 are arranged in an alternating zigzag fashion. Thereby, it is possible to expand the package in the required region only, whilst avoiding unnecessary increase in the package dimensions. There may also be cases where the first region 20 and second region 21 do not lie in the same plane.

(Fourth Embodiment)

Figure 7:
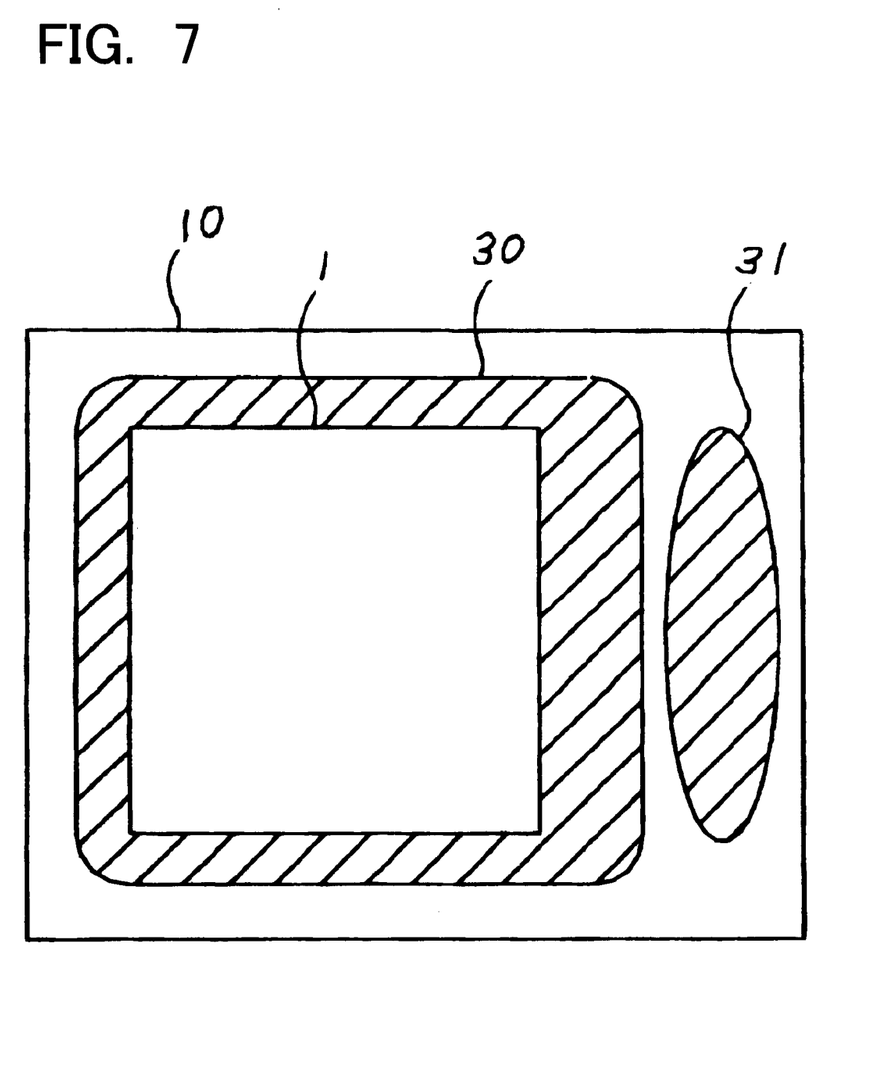
FIG. 7 is an upper face view of a semiconductor device according to a fourth embodiment of the present invention.

FIG. 7 is an upper face view of a semiconductor device according to a fourth embodiment of the present invention. When providing a flip chip bonding of an LSI chip 1 on a semiconductor package 10, in order to improve reliability, under-fill resin is sometimes filled into the gap between the LSI chip 1 and the semiconductor package 10, and an under-fill resin filling region 30 surrounding the LSI chip 1, but in some cases, it is necessary to ensure a minimum under-fill resin supply region 31 in order to inject under-fill resin, during the assembly process.

In so doing, expansion of the single chip package in all four edge directions is avoided, and by performing expansion in one edge direction only, the semiconductor package 10 is prevented from becoming large in size. In other words, the required amount of under-fill resin is dropped into the under-fill resin supply region 31, and this under-fill resin fills uniformly into the gap between the LSI chip 1 and the semiconductor package 10, and the periphery of the LSI chip 1, by means of capillary action.

(Fifth Embodiment)

Figure 8:
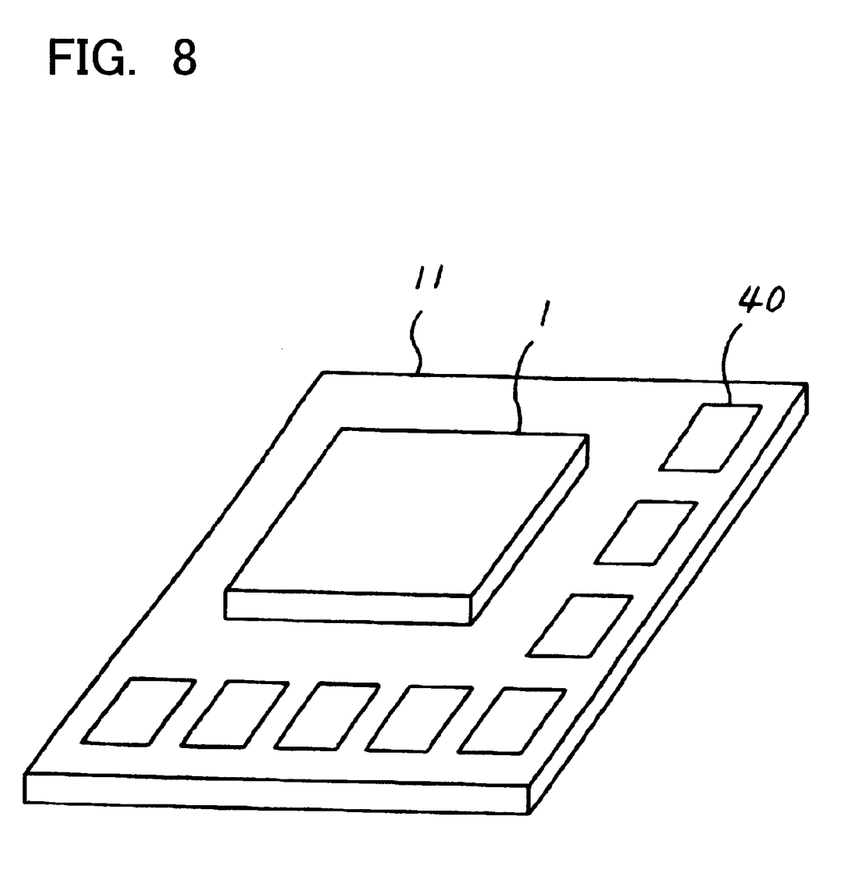
FIG. 8 is a perspective view of a semiconductor device according to a fifth embodiment of the present invention.

FIG. 8 is a perspective view of a semiconductor device according to a fifth embodiment of the present invention. Here, an LSI chip 1 and testing and measuring pin pads 40 are disposed on the upper face of a single chip package 11 which has been expanded in two directions.

An LSI chip 1 generally comprises pins for testing and measuring the LSI chip 1 which are not used during actual function or application. These pins are only used for judging whether the LSI chip 1 is satisfactory or not and in a inspection at the shipment, and once this role has been completed, they are obsolete in the system circuit.

Thus, the spare space in the whole bi-directionally expanded single chip package 11 is assessed, and if there is spare space, then pins which are not used at all in the actual applications of the LSI chip 1 are disposed, as testing and measuring pin pads 40, in the portion where the bi-directionally expanded single chip package 11 has no connecting function with the circuit board forming the system.

(Sixth Embodiment)

FIG. 9 shows upper face views of multi-chip module (MCM) packages according to a sixth embodiment of the present invention consisting of four different versions.

Commonly in all four versions, FIGS. 9(A), (B), (C), (D), two LSI chips 51, 52 are mounted, and there exists a mounting region 53 comprising not only the surface regions of the package covered by the respective LSI chips, but also an inner side region circumscribed about the surface regions of the package covered by the plurality of LSI chips, and a first region 54 of the package, the aforementioned mounting region 53 being located in the centre of this first region 54, and the second regions 55, 56, 57, 58 (marked by hatching) being adjoined respectively to the first region 54 according to requirement. The whole packages are respectively labelled with numbers 50, 60, 70, 80.

Embodiments of the present invention were described above, but the present invention is not limited to the foregoing embodiments and may also be achieved by appropriate modifications or combination with other technology, in accordance with the essence of the present invention.

In the present invention, by providing a semiconductor device comprising a package having a mounting region for semiconductor elements, a first region containing the above-described mounting region, and second regions partially adjoining the periphery of the aforementioned first region, it is possible to reduce package dimensions to a necessary minimum, without impairing the required functions of the semiconductor device and without substantially generating distortion of the semiconductor device.

What is claimed is:

1. A semiconductor device, comprising:
   a package, comprising:
      a semiconductor element comprising a chip portion and a pad portion;

a mounting region to mount the chip portion;
a first region within an area to mount said pad portion, said mounting region covering a portion of the first region and substantially sharing point symmetry with said mounting region, a width of a portion of said first region not covered by said mounting region being substantially uniform;
a second region provided at a perimeter edge of said first region and not substantially sharing point symmetry with said mounting region; and
a connecting unit between said pad portion and said chip portion,
wherein said semiconductor element is mounted on the mounting region by a flip chip bonding, a gap between said semiconductor element and said mounting region is filled with under-fill resin, and a region for supplying said under-fill resin is formed in said second region.

2. A semiconductor device comprising:
a semiconductor element;
a first region;
a mounting region covering a portion of the first region to mount the semiconductor element thereon; and
a second region at a perimeter edge of the first region,
the semiconductor element being mounted on the mounting region by a flip chip bonding, a gap between the semiconductor element and the mounting region being filled with an under-fill resin, and a region to supply the under-fill resin being formed in the second region.

3. A semiconductor device comprising:
a package, comprising:
a semiconductor element;
a first region;
a mounting region covering a portion of the first region to mount the semiconductor element thereon; and
a second region at a perimeter edge of the first region,
the semiconductor element being mounted on the mounting region by a flip chip bonding, a gap between the semiconductor element and the mounting region being filled with an under-fill resin, and a region to supply the under-fill resin being formed in the second region.

* * * * *